(12) United States Patent
Kobayashi et al.

(10) Patent No.: US 9,525,110 B2
(45) Date of Patent: Dec. 20, 2016

(54) PHOSPHOR, LIGHT EMITTING DEVICE AND LIGHTING APPARATUS

(71) Applicant: DENKI KAGAKU KOGYO KABUSHIKI KAISHA, Tokyo (JP)

(72) Inventors: Keita Kobayashi, Omuta (JP); Yasuhito Fushii, Omuta (JP)

(73) Assignee: Denka Company Limited, Tokyo (JP)

( * ) Notice: Subject to any disclaimer, the term of this patent is extended or adjusted under 35 U.S.C. 154(b) by 120 days.

(21) Appl. No.: 14/436,079

(22) PCT Filed: Sep. 19, 2013

(86) PCT No.: PCT/JP2013/075278
§ 371 (c)(1),
(2) Date: Apr. 15, 2015

(87) PCT Pub. No.: WO2014/061393
PCT Pub. Date: Apr. 24, 2014

(65) Prior Publication Data
US 2015/0280079 A1    Oct. 1, 2015

(30) Foreign Application Priority Data
Oct. 16, 2012   (JP) ................................. 2012-228532

(51) Int. Cl.
| | |
|---|---|
| *C09K 11/80* | (2006.01) |
| *F21V 9/08* | (2006.01) |
| *H01L 33/50* | (2010.01) |
| *F21Y 101/02* | (2006.01) |
| *C09K 11/77* | (2006.01) |
| *C09K 11/08* | (2006.01) |
| *C04B 35/44* | (2006.01) |
| *C04B 35/581* | (2006.01) |

(52) U.S. Cl.
CPC ............. *H01L 33/502* (2013.01); *C04B 35/44* (2013.01); *C04B 35/581* (2013.01); *C09K 11/0883* (2013.01); *C09K 11/7721* (2013.01); *C09K 11/7774* (2013.01); *C04B 2235/3224* (2013.01); *C04B 2235/3225* (2013.01); *C04B 2235/3229* (2013.01); *H01L 2224/48091* (2013.01); *H01L 2224/48247* (2013.01); *H01L 2924/181* (2013.01)

(58) Field of Classification Search
CPC ......................... C09K 11/7721; H01L 33/502
See application file for complete search history.

(56) References Cited

U.S. PATENT DOCUMENTS

| | | | |
|---|---|---|---|
| 6,066,861 A | 5/2000 | Höhn et al. ...................... 257/99 |
| 7,267,786 B2 * | 9/2007 | Fiedler ............... C09K 11/7769 |
| | | | 252/301.4 F |
| 9,080,105 B1 * | 7/2015 | Liu ..................... C09K 11/7774 |
| 2006/0158097 A1 | 7/2006 | Juestel et al. ................. 313/503 |
| 2009/0008663 A1 | 1/2009 | Shimizu et al. ................ 257/98 |
| 2009/0187234 A1 | 7/2009 | Meyer et al. ................... 607/88 |
| 2012/0112130 A1 | 5/2012 | Wu et al. ............... 252/301.4 P |
| 2013/0113364 A1 | 5/2013 | Fiedler et al. ................ 313/503 |

FOREIGN PATENT DOCUMENTS

| | | |
|---|---|---|
| CN | 1558454 A | 12/2004 |
| CN | 101128563 A | 2/2008 |
| CN | 101195744 A | 5/2008 |
| JP | 2009-539219 A | 11/2009 |
| JP | 2012-62444 A | 3/2012 |

OTHER PUBLICATIONS

International Search Report dated Oct. 15, 2013, issued to the corresponding International Application No. PCT/JP2013/075278.
Chinese Office Action dated Feb. 14, 2016, issued by the Chinese Patent Office in corresponding application 201380053665.2.

* cited by examiner

*Primary Examiner* — Carol M Koslow
(74) *Attorney, Agent, or Firm* — Stein IP, LLC

(57) ABSTRACT

An object of the invention is to provide a phosphor that emits a light containing much red and green light components and a light-emitting device and a lighting apparatus comprising the phosphor that have favorable color rendering properties. An oxide nitride phosphor having a garnet structure represented by Formula [1]: $A_w Al_x C_y:Ce_z$, in Formula [1], $A=(Lu_a,Y_b)$, $a+b=1$, $0<a<1$, $0<b<1$, $C=(O_c,N_d)$, $10 \leq c+d \leq 16$, $1.4 \leq c/d$, $2 \leq w+z \leq 4$, $4.0 < x \leq 7.0$); the molar ratio of Ce/A is $\geq 0.015$ and the nitrogen content is 0.007 mass % or more.

3 Claims, 1 Drawing Sheet

PHOSPHOR, LIGHT EMITTING DEVICE AND LIGHTING APPARATUS

CROSS-REFERENCE TO RELATED APPLICATIONS

This application claims the benefit of International Application No. PCT/JP2013/075278, filed Sep. 19, 2013, which claims the benefit of priority to Japanese Application No. 2012-228532, filed Oct. 16, 2012, in the Japanese Patent Office, the disclosures of which are incorporated herein by reference.

TECHNICAL FIELD

The present invention relates to a phosphor, a light-emitting device containing the phosphor, and a lighting apparatus having the light-emitting device.

BACKGROUND ART

Patent Document 1 discloses a green phosphor containing LuAG:Ce as raw material.
Patent Document 2 discloses a colored and white light-emitting lighting apparatus containing LuAG:Ce that converts blue or UV light to green light.

CITATION LIST

Patent Literatures
[Patent Document 1] JP-A No. 2012-062444
[Patent Document 2] JP-T No. 2009-539219

SUMMARY OF INVENTION

Technical Problem

An object of the present invention is to provide a phosphor that emits a light containing much red and green light components, as it is excited by a light having a wavelength of 350 nm to 500 nm, and a light-emitting device containing the phosphor that has favorable color rendering properties.

Solution to Problem

The inventors have found that there is a new problem that, when green and red phosphors are used, as they are mixed, to improve the color rendering properties of a white-emission lighting apparatus while preserving its red and green components, the light emitted from one phosphor is absorbed by another phosphor, leading to deterioration of luminous efficiency.

After intensive studies, the inventors have found that it is possible, by adding large amounts of nitrogen and cerium atoms to a phosphor made of a compound having a garnet-type structure and an activator mainly of a rare earth element and thus replacing Lu therein partially with Y, to obtain a phosphor with improved chromaticity X, longer peak wavelength, and larger half value width, that contains a red fluorescent light component at a wavelength of 600 to 700 nm in a larger amount and thus emits a light containing green to red components, and made the present invention.

The present invention relates to a phosphor having a garnet structure represented by General Formula: $A_wAl_xC_y$:$Ce_z$, wherein $A=(Lu_a,Y_b)$, $a+b=1$, $0<a<1$, $0<b<1$, $C=(O_c,N_d)$, $10\leq(c+d)xy\leq16$, $1.4\leq c/d$, $2\leq w+z\leq4$, $4.0\leq x\leq7.0$, the molar ratio Ce/A is $\geq 0.015$ and the nitrogen content is 0.007 mass % or more. The present invention also relates to a light-emitting device containing the phosphor and a lighting apparatus having the light-emitting device.

Advantageous Effects of Invention

The present invention provides a phosphor that is excited by a light having a wavelength of 350 nm to 500 nm and emits a light containing much red light to green light components and a light-emitting device containing the phosphor that has favorable color rendering properties.

DESCRIPTION OF EMBODIMENTS

Figure 1:
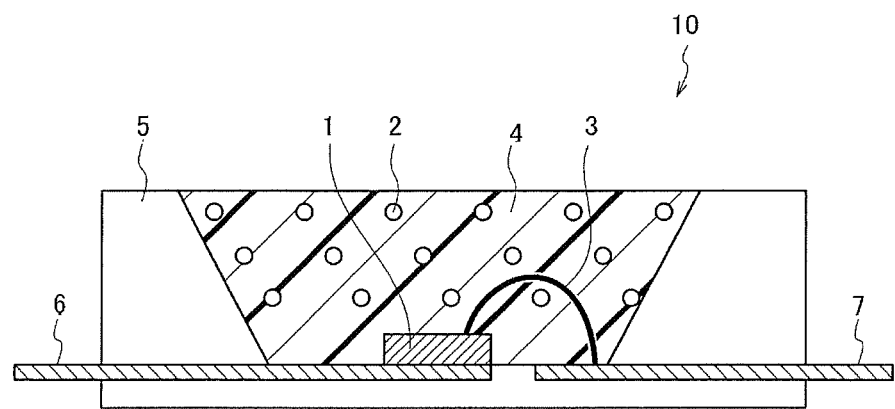
FIG. 1 is a schematic view (partial crosssectional view) showing the configuration of the light-emitting device in a second embodiment of the present invention.

The first embodiment of the present invention relates to a phosphor having a garnet structure represented by the following Formula [1]:

$$A_wAl_xC_y\text{:}Ce_x \qquad \text{Formula [1]}$$

in Formula [1] above, $A=(Lu_a,Y_b)$, $a+b=1$, $0<a<1$, $0<b<1$, $C=(O_c,N_d)$, $10\leq(c+d)xy\leq16$, $1.4\leq c/d$, $2\leq w+z\leq4$, $4.0<x\leq7.0$;
the molar ratio Ce/A is $\geq 0.015$, and
the nitrogen content in the phosphor is 0.007 mass % or more.

The phosphor according to the present invention has an advantage that it is excited by a light having a wavelength of 350 nm to 500 nm (in particular, a purple to blue light having a wavelength of 420 nm to 470 nm) and emits mostly red light and/or green light. It is preferably a phosphor that emits a yellow light containing much red and green light components. As the phosphor according to the present invention is excited efficiently by a light from a blue light-emitting element and emits a visible light, it gives a white LED emitting a pure white light in combination with a blue LED. Thus, the present invention is extremely useful industrially.

The garnet structure is a crystal structure similar to the crystal structure represented by garnet ($A_3B_5O_{12}$; A is a bivalent metal ion of one or more elements selected from the group consisting of Ca, Mg, and Fe, B is a trivalent metal ion of one or more elements selected from the group consisting of Al, Fe, and Cr, and O represents an oxygen atom.)

Lu represents a lutetium atom; Y represents an yttrium atom; part of the lutetium or yttrium atom may be replaced alone or in combination with Sc, La, Gd and/or Sm.

Ce represents a cerium atom; part of the cerium atom may be replaced alone or in combination with Pr, Nd, Eu, Tb, Dy, Ho, Er, Tm, Yb, and/or Mn.

Al represents an aluminum atom; part of the aluminum atom may be replaced alone or in combination with Ga, Si, and/or In.

O represents an oxygen atom and N represents a nitrogen atom.

The range of b above is preferably $0.02\leq b\leq 0.7$, more preferably $0.042\leq b\leq 0.625$.

The range of (c+d)×y above is preferably 10≤(c+d)×y≤16, more preferably 11≤(c+d)×y≤16, and still more preferably 11.6≤(c+d)×y≤15.8.

The lowest value of the range of c/d is preferably 1.4≤c/d, more preferably 100≤c/d, still more preferably 200≤c/d, further more preferably 300≤c/d, and even more preferably 350≤c/d. Alternatively, the largest value of the range c/d is preferably c/d≤3000 and more preferably c/d≤2500.

The range of w+z is preferably 2≤w+z≤4 and more preferably 2.6≤w+z≤3.6.

The range of x is preferably 4.0<x≤7.0 and more preferably 5.0≤x≤7.0.

The lowest value of the molar ratio Ce/A above is preferably 0.015≤Ce/A, more preferably 0.02≤Ce/A, and still more preferably 0.026≤Ce/A, and the largest value thereof is preferably Ce/A≤0.500, more preferably Ce/A≤0.400, and still more preferably Ce/A≤0.300.

The lowest value of the nitrogen content is preferably 0.007 mass % or more and more preferably 0.009 mass % or more. The largest value of the nitrogen content is not particularly limited, but preferably 0.1 mass % or less and more preferably 0.08 mass %.

The molar ratio of Lu, Y, Ce, and Al is, preferably Lu:Y:Ce:Al=0.90 to 2.32:0.10 to 1.50:0.18 to 1.50:5.00 to 7.00. More preferably, the molar ratio of O and N is O:N=12.09 to 15.75:0.009 to 0.045.

The molar ratio Ce/A is preferably 0.015 or more, as it is not possible to obtain the advantage of containing Ce and the amount of red component decreases when it is too small.

The content of nitrogen is preferably 0.007 mass % or more, as the amount of red component decreases when it is too small.

Yttrium should be contained, because the amount of red component decreases when yttrium is not contained.

The value x (of aluminum) is more than 4.0 and 7.0 or less, as the emission intensity decreases distinctively when it is too small and it also decreases when it is too large.

The nitrogen atoms in the phosphor according to the present invention are present in the crystal lattice and/or between the crystal lattices of the compound having a garnet-type structure.

The phosphor according to the present invention can be produced by mixing Lu-, Y-, Ce-, Al-, O-, and N-containing compounds and calcining the mixture.

In production of the phosphor, the raw powder mixture is preferably calcined in a pressurized nitrogen environment. It may be calcined in argon atmosphere. The pressure applied is preferably 0.1 to 10 MPa, more preferably 0.1 to 2 MPa, and still more preferably 0.5 to 1.5 MPa. The calcination temperature is preferably 1000 to 2000° C. and more preferably 1500 to 2000° C. The calcination period is preferably 0.5 to 24 hours and more preferably 1 to 12 hours.

The second embodiment of another invention relates to a light-emitting device having a light-emitting element and the phosphor described above.

The light-emitting element for use may by any device if it can emit a light having a wavelength in the range of 350 nm to 500 nm. The light-emitting device may contain not only the phosphor described above but also other phosphors such as red- and green-emission phosphors, if these phosphors do not inhibit emission of the phosphor described above.

FIG. 1 is a view illustrating an example of the configuration of the light-emitting device of the present embodiment, but the light-emitting device according to the present invention is not limited thereto. As shown in FIG. 1, the light-emitting device 10 in the present embodiment has a light-emitting element 1 (for example, blue LED chip) and phosphors 2 placed in the region on the light-emitting face of the light-emitting element, and part or all of the phosphors 2 used are the phosphor according to the present invention described above.

Examples of the light-emitting element 1 used include various LEDs such as ultraviolet light-emitting diodes (UV-LEDs) and blue light-emitting diodes (blue LEDs), phosphor lamps, laser diodes (LDs), and the like, and LEDs are favorable. All of the phosphors 2 used may be the phosphor according to the present invention described above, but red-, orange-, yellow-, green-, blue- and/or other emission phosphors may be used in combination. It is thus possible to regulate the color of the light emitted from the light-emitting device.

The light-emitting device 10 in the present embodiment has a light-emitting element 1 formed on a conductive terminal (lead frame) 6 and the light-emitting element 1 is sealed with a sealing resin 4 containing phosphor 2 dispersed therein in a container (frame) 5 on the conductive terminal 6. The light-emitting element 1 is connected to another conductive terminal (lead frame) 7 via a conductive wire (bonding wire) 3.

The light-emitting device may be covered (molded) arbitrarily with a visible light-transmitting resin on the periphery. Examples of the visible light-transmitting resins include epoxy resins, urethane resins, silicone resins, and the like. The visible light-transmitting resin may contain, as needed, additives such as viscosity improvers, dispersing agents, and ultraviolet absorbents.

The light-emitting device has externally, for example, a cannonball shape, a chip shape, a multi-segment shape, or the like.

The light-emitting device 10 in the present embodiment emits a visible light having a wavelength of 350 to 500 nm containing ultraviolet, purple, blue, and green lights (in particular, a blue light having a wavelength of 420 to 470 nm) as excitation light from the light-emitting element 1 and irradiates it to the phosphor 2 made of a compound having a garnet-type structure and others. By irradiation with the excitation light, the compound having a garnet-type structure and others emit a light having a peak in a wavelength region of 546 nm or more (favorably, 546 to 555 nm). The compound having a garnet-type structure used in the light-emitting device 10 in the present embodiment has favorable external quantum efficiency and chromaticity. Favorably, it has an external quantum efficiency of 40% or more and a chromaticity X of 0.388 or more (favorably, a chromaticity X of 0.388 to 0.450). Thus, the light-emitting device 10 in the present embodiment emits a light containing more red and green light components and shows high fluorescence intensity.

The third embodiment of another invention relates to a lighting apparatus having light-emitting device containing the phosphor according to the present invention. The lighting apparatus may contain only one light-emitting device containing the phosphor according to the present invention or may contain multiple light-emitting devices in combination. The number and the order of the multiple light-emitting devices may be selected appropriately according to the size, illuminance, and others of the lighting apparatus.

For example in a lighting apparatus, the AC input terminal of the lighting module is connected to a commercial AC source and one or more light-emitting devices are connected in series or parallel to the DC output terminal of the lighting module, but the lighting apparatus according to the present invention is not particularly limited such a configuration.

The lighting apparatus may be, for example, an electric lamp-, fluorescent lamp-, down light-, surface illumination-type apparatus, but is not particularly limited thereof.

Figure 2:
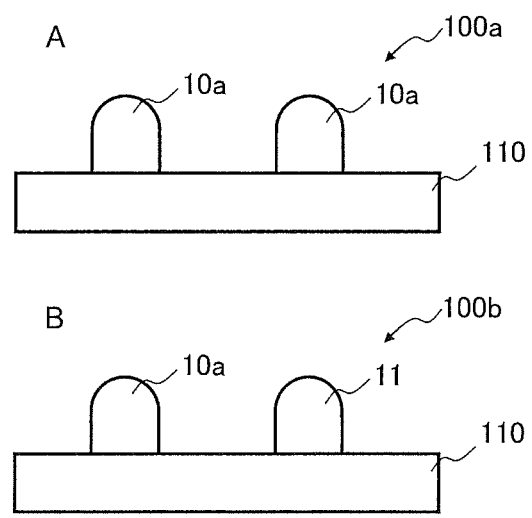
FIGS. 2A and B are schematic views showing the configuration of the lighting apparatus in a third embodiment of the present invention.

In the lighting apparatus 100a of the present embodiment, as shown in FIG. 2A, two or more light-emitting devices 10a are mounted on a circuit board 110, as they are covered with a visible light-transmitting resin.

The circuit board 110 has a drive circuit formed thereon for operation of the light-emitting device 10a.

The number of the light-emitting devices 10a and the order of the light-emitting devices 10a formed on the circuit board 110 can be selected arbitrarily according to the application of the lighting apparatus 100. For example when the lighting apparatus 100 is used as a linearly emitting light source, multiple light-emitting devices 10a are placed linearly; when the lighting apparatus 100 is used as a surface-emitting device, multiple light-emitting devices 10a are placed two-dimensionally; and when the lighting apparatus 100a is used as a lightening light source, one light-emitting device 10a is used. In this way, the lighting apparatus 100a can emit a yellow light containing much red and green lights.

In the lighting apparatus 100b shown in FIG. 2B, a light-emitting device 10a and a blue LED 11 are formed on a circuit board 110, as they are covered with a visible light-transmitting resin. Multiple sets of the light-emitting device 10a and the LED 11 may be formed thereon. The configuration and the like of the drive circuit and the light-emitting devices may be the same as those of the lighting apparatus 100a. In this way, the lighting apparatus 100b can emits a white light, using the light-emitting device according to the present invention and a blue light-emitting device in combination.

EXAMPLES

Hereinafter, advantageous effects of the present invention will be described with reference to Examples and Comparative Examples of the present invention, but the present invention is not limited thereto. Examples will be described, as compared with Comparative Examples, with reference to Tables 1 and 2.

TABLE 1

| | | Example | | | | | | | | | |
|---|---|---|---|---|---|---|---|---|---|---|---|
| | | 1 | 2 | 3 | 4 | 5 | 6 | 7 | 8 | 9 | 10 |
| Phosphor | Lu (molar ratio): a × w | 1.00 | 1.90 | 2.32 | 1.00 | 1.90 | 2.32 | 2.32 | 2.00 | 2.30 | 0.90 |
| | Y (molar ratio): b × w | 0.50 | 0.50 | 0.50 | 0.50 | 0.50 | 0.50 | 0.50 | 0.50 | 0.10 | 1.50 |
| | Ce (molar ratio): z | 1.50 | 0.60 | 0.18 | 1.50 | 0.60 | 0.18 | 0.70 | 0.18 | 0.60 | 0.60 |
| | Al (molar ratio): x | 7.00 | 7.00 | 7.00 | 5.00 | 5.00 | 5.00 | 5.00 | 5.00 | 7.00 | 7.00 |
| | O (molar ratio): c × y | 15.75 | 15.3 | 15.09 | 12.75 | 12.3 | 12.09 | 13.13 | 11.61 | 15.3 | 15.3 |
| | N (molar ratio): d × y | 0.045 | 0.026 | 0.009 | 0.036 | 0.022 | 0.005 | 0.028 | 0.016 | 0.025 | 0.028 |
| | a | 0.667 | 0.792 | 0.823 | 0.667 | 0.792 | 0.823 | 0.823 | 0.800 | 0.958 | 0.375 |
| | b | 0.333 | 0.208 | 0.177 | 0.333 | 0.208 | 0.177 | 0.177 | 0.200 | 0.042 | 0.625 |
| | c | 0.997 | 0.998 | 0.999 | 0.997 | 0.998 | 0.999 | 0.998 | 0.999 | 0.998 | 0.998 |
| | d | 0.003 | 0.002 | 0.001 | 0.003 | 0.002 | 0.000 | 0.002 | 0.001 | 0.002 | 0.002 |
| | w | 1.500 | 2.400 | 2.820 | 1.500 | 2.400 | 2.820 | 2.820 | 2.500 | 2.400 | 2.400 |
| | x | 7.000 | 7.000 | 7.000 | 5.000 | 5.000 | 5.000 | 5.000 | 5.000 | 7.000 | 7.000 |
| | y | 15.795 | 15.326 | 15.099 | 12.786 | 12.322 | 12.098 | 13.158 | 11.626 | 15.325 | 15.328 |
| | z | 1.500 | 0.600 | 0.180 | 1.500 | 0.600 | 0.180 | 0.700 | 0.180 | 0.600 | 0.600 |
| | a + b | 1.000 | 1.000 | 1.000 | 1.000 | 1.000 | 1.000 | 1.000 | 1.000 | 1.000 | 1.000 |
| | (c + d) × y | 15.795 | 15.326 | 15.099 | 12.786 | 12.322 | 12.095 | 13.158 | 11.626 | 15.325 | 15.328 |
| | c/d | 350 | 588 | 1677 | 354 | 559 | 2418 | 469 | 726 | 612 | 546 |
| | w + z | 3.00 | 3.00 | 3.00 | 3.00 | 3.00 | 3.00 | 3.52 | 2.68 | 3.00 | 3.00 |
| | Ce/(Lu + Y) (molar ratio) | 0.214 | 0.086 | 0.026 | 0.300 | 0.120 | 0.036 | 0.140 | 0.036 | 0.086 | 0.086 |
| | Nitrogen content (mass %) | 0.072% | 0.041% | 0.014% | 0.066% | 0.039% | 0.009% | 0.044% | 0.030% | 0.038% | 0.048% |
| Calcination environment | | Nitrogen 0.7 MPa | Nitrogen 0.7 MPa | Nitrogen 0.7 MPa | Nitrogen 0.7 MPa | Nitrogen 0.7 MPa | Nitrogen 0.7 MPa | Nitrogen 0.7 MPa | Nitrogen 0.7 MPa | Nitrogen 0.7 MPa | Nitrogen 0.7 MPa |
| External quantum efficiency (%) | | 44.1 | 57.2 | 70.8 | 43.9 | 53.5 | 62.9 | 62.4 | 59.3 | 57.0 | 58.1 |
| Chromaticity X | | 0.452 | 0.424 | 0.393 | 0.450 | 0.409 | 0.389 | 0.394 | 0.392 | 0.422 | 0.428 |
| Peak wavelength | | 554.8 | 548.3 | 547.3 | 553.2 | 547.7 | 546.4 | 547.5 | 546.8 | 547.9 | 551.8 |

TABLE 2

| | | Comparative Example | | | | | |
|---|---|---|---|---|---|---|---|
| | | 1 | 2 | 3 | 4 | 5 | 6 |
| Phosphor | Lu (molar ratio): a × w | 2.46 | 2.46 | 2.32 | 2.32 | 2.82 | 2.32 |
| | Y (molar ratio): b × w | 0.50 | 0.50 | 0.50 | 0.50 | 0.00 | 0.50 |
| | Ce (molar ratio): z | 0.04 | 0.04 | 0.18 | 0.18 | 0.18 | 0.18 |
| | Al (molar ratio): x | 5.00 | 7.00 | 5.00 | 7.00 | 5.00 | 4.00 |

TABLE 2-continued

| | Comparative Example | | | | | |
|---|---|---|---|---|---|---|
| | 1 | 2 | 3 | 4 | 5 | 6 |
| O (molar ratio): c × y | 12.02 | 15.02 | 12.09 | 15.09 | 12.09 | 10.59 |
| N (molar ratio): d × y | 0.005 | 0.006 | 0.002 | 0.002 | 0.006 | 0.012 |
| a | 0.831 | 0.831 | 0.823 | 0.823 | 1.000 | 0.823 |
| b | 0.169 | 0.169 | 0.177 | 0.177 | 0.000 | 0.177 |
| c | 1.000 | 1.000 | 1.000 | 1.000 | 1.000 | 0.999 |
| d | 0.0004 | 0.0004 | 0.0002 | 0.0001 | 0.0005 | 0.0011 |
| w | 2.960 | 2.960 | 2.820 | 2.820 | 2.820 | 2.820 |
| x | 5.000 | 7.000 | 5.000 | 7.000 | 5.000 | 4.000 |
| y | 12.025 | 15.026 | 12.092 | 15.092 | 12.096 | 10.602 |
| z | 0.040 | 0.040 | 0.180 | 0.180 | 0.180 | 0.180 |
| a + b | 1.000 | 1.000 | 1.000 | 1.000 | 1.000 | 1.000 |
| (c + d) × y | 12.025 | 15.026 | 12.092 | 15.092 | 12.096 | 10.602 |
| c/d | 2404 | 2503 | 6045 | 7545 | 2015 | 883 |
| w + z | 3.00 | 3.00 | 3.00 | 3.00 | 3.00 | 3.00 |
| Ce/(Lu + Y) (molar ratio) | 0.008 | 0.006 | 0.036 | 0.026 | 0.036 | 0.045 |
| Nitrogen content (mass %) | 0.009% | 0.009% | 0.003% | 0.003% | 0.010% | 0.022% |
| Calcination environment | Nitrogen 0.7 MPa | Nitrogen 0.7 MPa | Vacuum | Vacuum | Nitrogen 0.7 MPa | Nitrogen 0.7 MPa |
| External quantum efficiency (%) | 66.1 | 72.9 | 64.3 | 72.6 | 62.0 | 39.8 |
| Chromaticity X | 0.384 | 0.385 | 0.371 | 0.372 | 0.386 | 0.386 |
| Peak wavelength | 545.8 | 545.7 | 538.5 | 539.4 | 544.7 | 545.7 |

Example 1

As shown in Table 1, the phosphor of Example 1 is a phosphor represented by General Formula: $(Lu_a,Y_b)_w Al_x(O_c,N_d)_y:Ce_z$, wherein a+b=1, a=0.667, b=0.333, (c+d)×y=15.795, c/d=350, w+z=3.00, x=7.000, y=15.795, Ce/(Lu+Y)=0.214, and nitrogen content=0.072 mass %.

The values of the phosphor above are determined using an ICP apparatus or an oxygen-nitrogen analyzer (EMGA-920 produced by HORIBA, Ltd.).

The values of the phosphors shown in Tables 1 and 2 are those when raw materials were blended and thus targeted values.

Results of the external quantum efficiency, chromaticity X, and peak wavelength of the phosphor prepared in Example 1 are summarized in Table 1. The phosphor of Example 1 was superior in any measured value of external quantum efficiency, chromaticity X, or peak wavelength.

The acceptance criteria in the [Examples] in these tests are 40% or more for the external quantum efficiency, 0.388 or more for the chromaticity X, and 546.0 nm or more for the peak wavelength.

In the tests above, the external quantum efficiency and the peak wavelength in Tables 1 and 2 were determined using a spectrophotometer (MCPD-7000 produced by Otsuka Electronics Co., Ltd.).

<Fluorescence Spectrum>

In the test, the peak wavelength was determined using a spectrophotometer (MCPD-7000 produced by Otsuka Electronics Co., Ltd.) in the following manner:

A sample phosphor was filled into a concave cell, as the surface was flattened, and an integrating sphere was connected thereto. A monochromatic (blue) light having a wavelength of 455 nm was introduced into the integrating sphere from an light source (Xe lamp) via an optical fiber. The monochromatic light was irradiated to the phosphor sample as excitation source and the fluorescence spectrum from the sample was measured. The peak wavelength was determined from the fluorescence spectrum obtained.

<External Quantum Efficiency>

In the test, the luminous efficiency (external quantum efficiency) was determined using a spectrophotometer (MCPD-7000 produced by Otsuka Electronics Co., Ltd.) in the following manner: A standard reflector (Spectralon produced by Labsphere, Inc.) having a reflectance of 99% was placed in the sampling unit and the spectrum of the light excited by an excitation light having a wavelength of 455 nm was determined. The excitation light photon number (Qex) then was calculated from the spectrum in a wavelength range of 450 nm to 465 nm. Then, a sample was placed in the sampling unit and the reflected excitation light photon number (Qref) and the fluorescence photon number (Qem) were calculated from the spectrum data obtained.

The reflected excitation light photon number was calculated in the wavelength range identical with that for the excitation light photon number, while the fluorescence photon number in the wavelength range of 465 nm to 800 nm. The external quantum efficiency (=Qem/Qex×100), the absorption rate (=(Qex−Qref)/Qex×100), and the internal quantum efficiency (=Qem/(Qex−Qref)×100) were determined from the three kinds of photon numbers obtained.

<Chromaticity X (CIEx)>

In the test, the chromaticity X in Tables 1 and 2, which is a value of CIE 1931 (XYZ color system), was determined using an instantaneous multichannel photospectroscopic system (MCPD-7000 produced by Otsuka Electronics Co., Ltd.).

The chromaticity X (CIEx) was determined by analyzing the fluorescence spectrum of the all light flux of the fluorescence obtained by excitation at 455 nm, using an integrating sphere in the instantaneous multichannel photospectroscopic system (MCPD-7000 produced by Otsuka Electronics Co., Ltd.). The measurement was performed according to the method shown in a reference literature: Kazuaki Ohkubo et al., "Absolute Fluorescent Quantum Efficiency of NBS Phosphor Standard Samples" Journal of the Illuminating Engineering Institute of Japan, 83, 2, pp. 87-93, 1999.

<Composition Analysis of Lu, Y, Ce, Al, O, and N and Nitrogen Content>

The values of the phosphors in Tables 1 and 2 were determined by dissolving a raw mixture powder by alkali fusion method and then measuring the contents therein using an ICP emission spectrophotometer (CIROS-120 produced by Rigaku Corporation). The nitrogen content (mass %) in Tables 1 and 2 was determined by using an oxygen-nitrogen analyzer (EMGA-920 produced by HORIBA, Ltd.).

<Preparative Method: Mixing Step>

Although not shown in the Tables, the phosphor of Example 1 is a product prepared from the following raw materials: $Lu_2O_3$ (manufactured by Wako Pure Chemical Industries, Ltd.): 22.86 mass %, $Y_2O_3$ (manufactured by Wako Pure Chemical Industries, Ltd.): 6.49 mass %, $CeO_2$ (produced by Wako Pure Chemical Industries, Wako special grade): 29.66 mass %, and $Al_2O_3$ (produced by Taimei Chemicals Co., Ltd., TM-DAR grade): 41.00 mass %. The molar ratio of Lu:Y:Ce:Al, as in the raw material, was 1.0:0.5:1.5:7.0.

The raw materials were mixed in a super mixer of Kawata and then classified. The classification step was a step of screening the raw material with a nylon screen having an opening of 850 μm.

<Preparative Method: Calcination Step>

The classified raw material was filled into a cylindrical boron nitride container (N-1 grade produced by DENKI KAGAKU KOGYO KABUSHIKI KAISHA) having a size of 8 cm (internal diameter)×8 cm (height) with a cap in an amount of 50 g and the boron nitride container was placed in a graphite box having a size of 100 cm×50 cm (internal diameter)×13 cm (height) with a top cap. The raw material was heat-treated, as in the graphite box, in an electric furnace under a nitrogen atmosphere pressurized at 0.7 MPa at 1700° C. for 15 hours. The raw material was converted to a phosphor by the calcination treatment.

The phosphor after calcination was cooled to room temperature, crushed, and classified with a screen having an opening of 250 μm. The phosphor after classification is the phosphor of Example 1.

Example 2

The phosphor of Example 2 is a phosphor containing lutetium at a higher molar ratio and cerium at a lower molar ratio than the phosphor of Example 1. The phosphor of Example 2 was prepared similarly to Example 1, unless specified otherwise, and those of Examples and Comparative Examples below were also prepared similarly.

Example 3

The phosphor of Example 3 is a phosphor containing lutetium at a higher molar ratio and cerium at a lower molar ratio than the phosphor of Example 2.

Example 4

The phosphor of Example 4 is a phosphor containing aluminum and oxygen at lower molar ratios than phosphor of Example 1.

Example 5

The phosphor of Example 5 is a phosphor containing aluminum and oxygen at lower molar ratios than the phosphor of Example 2.

Example 6

The phosphor of Example 6 is a phosphor containing aluminum and oxygen at lower molar ratios than the phosphor of Example 3.

Example 7

The phosphor of Example 7 is a phosphor containing cerium at a lower molar ratio than the phosphor of Example 6.

Example 8

The phosphor of Example 8 is a phosphor containing lutetium at a lower molar ratio than the phosphor of Example 6.

Example 9

The phosphor of Example 9 is a phosphor containing yttrium at a lower molar ratio.

Example 10

The phosphor of Example 10 is a phosphor containing yttrium at a higher molar ratio.

Comparative Example 1

The phosphor of Comparative Example 1 has a Ce/(Lu+Y) value of 0.008 and thus contains cerium at a lower ratio.

Comparative Example 2

The phosphor of Comparative Example 2 has a Ce/(Lu+Y) value of 0.006 and thus contains cerium at a lower ratio.

Comparative Example 3

The phosphor of Comparative Example 3 was prepared using raw materials identical with those used in Example 6, but the calcination step was carried out under vacuum, not in nitrogen atmosphere, and the nitrogen content was adjusted to 0.003%.

Comparative Example 4

The phosphor of Comparative Example 4 was prepared using raw materials similar to those used in Example 3, but the calcination step was carried out under vacuum, not in nitrogen atmosphere, and the nitrogen content was adjusted to 0.003%, similarly to Comparative Example 3.

Comparative Example 5

The phosphor of Comparative Example 5 was prepared without using yttrium in raw materials.

Comparative Example 6

The phosphor of Comparative Example 6 was prepared, as aluminum was used in an amount of 4 moles, which is outside the scope of the invention.

Comparison of Examples 1 to 3 and Comparative Example 2, Examples 4 to 6 and Comparative Example 1 in Tables 1 and 2 shows that increase in the molar ratio of cerium and nitrogen content leads to increase of chromaticity X and also of peak wavelength.

Comparison of Example 2, 9, 10, 6 and Comparative Example 5 in Tables 1 and 2 shows that increase of the molar ratio of yttrium leads to increase of chromaticity X and peak wavelength and also of the intensity of the red component.

When no yttrium was blended, as shown in Comparative Example 5, the intensity of the red component decreased.

Comparison of Examples 3 and 6, and Comparative Examples 3 and 4 in Tables 1 and 2 shows that calcination in nitrogen atmosphere leads to increase of nitrogen content and thus to increase of chromaticity X, peak wavelength, and intensity of the red component.

Comparison of Examples 1 to 6 and Comparative Example 6 in Table 1 shows that decrease in the aluminum oxide content leads to decrease of external quantum efficiency.

As described above, a phosphor that is improved in chromaticity X, peak wavelength, and half value width and increased in the amount of the red fluorescence component at a wavelength of 600 to 700 nm and yet emits a light containing green to red components was obtained by increasing the contents of nitrogen and cerium atoms and replacing Lu partially with Y.

Example 11

The invention of Example 11 relates to a light-emitting device that contains the phosphor described above and a light-emitting element, as shown in FIG. 1. When the phosphor of any one of Examples 1 to 10 was used as its phosphor, the light-emitting device of Example 11 showed favorable performance, as shown in Table 1.

Example 12

The invention of Example 12 relates to an electric lamp-type lighting apparatus having the light-emitting device of Example 11, although it is not shown in Figure. When the phosphor of any one of Examples 1 to 10 was used as its phosphor, the lighting apparatus showed favorable performance, as shown in Table 1. The lighting apparatuses of FIGS. 2A and B also show favorable performance similarly.

REFERENCE SIGNS LIST

1: Blue LED chip
2: Phosphor
3: Conductive wire
4: Sealing resin
5: Container
6: Conductive terminal
7: Another conductive terminal
10, 10a: Light-emitting device
11: Blue LED
100a, 100b: Lighting apparatus
110: Circuit board

The invention claimed is:

1. A phosphor having a garnet structure represented by General Formula:

$(Lu_a, Y_b)_w Al_x (O_c, N_d)_y : Ce_z$, wherein $a+b=1$, $0<a<1$, $0<b<1$, $10 \leq (c+d) \times y \leq 16$, $1.4 \leq c/d$, $2 \leq w+z \leq 4$, and $4.0 < x \leq 7.0$;

the molar ratio of Ce and (sum of Lu+Y) is $0.015 \leq Ce/(Lu+Y)$ and the nitrogen content is 0.007 mass % or more.

2. A light-emitting device comprising a light-emitting element and the phosphor according to claim 1.

3. A lighting apparatus comprising the light-emitting device according to claim 2.

* * * * *